US010999922B1

(12) United States Patent
Ziegler et al.

(10) Patent No.: US 10,999,922 B1
(45) Date of Patent: May 4, 2021

(54) SYSTEMS AND METHODS FOR IN-SILICON MEASUREMENT OF PRINTED CIRCUIT BOARD (PCB) TRACE IMPEDANCE

(71) Applicant: DELL PRODUCTS L.P., Round Rock, TX (US)

(72) Inventors: Charles Ziegler, Framingham, MA (US); Jason Pritchard, Hopkinton, MA (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/988,021

(22) Filed: Aug. 7, 2020

(51) Int. Cl.
*H05K 1/02* (2006.01)
*G01R 31/28* (2006.01)

(52) U.S. Cl.
CPC ......... *H05K 1/025* (2013.01); *G01R 31/2818* (2013.01); *H05K 1/0268* (2013.01)

(58) Field of Classification Search
CPC ... H05K 1/025; H05K 1/0268; G01R 31/2818
USPC .......................................................... 174/250
See application file for complete search history.

(56) References Cited

U.S. PATENT DOCUMENTS 9,000,786 B2 4/2015 Luo et al.
9,240,722 B2 1/2016 Luo et al.
9,678,555 B2 6/2017 Luo et al.
9,857,854 B2 1/2018 Zhang et al.
2014/0070846 A1* 3/2014 Zou .................. G01R 31/31924 326/82
2014/0208279 A1* 7/2014 Bhawmik .............. G06F 30/30 716/106
2016/0344352 A1* 11/2016 Chang ................ H03F 3/45475

OTHER PUBLICATIONS

Wikipedia, “Reflection Coefficient”, Obtain from Internet Jul. 23, 2020, 4 pgs.
Wikipedia, “Flash ADC”, Obtain from Internet Aug. 3, 2020, 3 pgs.
Texas Instruments, “How to Use the TDR Feature of DP83822”, Application Report, Aug. 2016, 6 pgs.
Hamlin et al., “Systems and Methods for Optimizing Perceived Software Application Load Delays”, U.S. Appl. No. 16/682,199, Filed May 4, 2020, DELL:284, 35 pgs.
Sunpower, “What Is Output Impedance?-Sunpower UK”, Jul. 2014, 2 pgs.

* cited by examiner

*Primary Examiner* — Tremesha S Willis
(74) *Attorney, Agent, or Firm* — Egan, Enders & Huston LLP.

(57) ABSTRACT

Systems and methods that may be implemented to provide on-board trace impedance testing for a system level board of an information handling system. A printed circuit board (PCB) of the system level board may include built-in test trace circuitry that may be used to measure board trace impedance so that the trace impedance of a fully assembled system level board may be tested and verified for compliance with trace impedance specification, and without requiring any disassembly of the board.

20 Claims, 11 Drawing Sheets

Reflection Coefficients $$\Gamma_L = \frac{Z_L - Z_o}{Z_L + Z_o} = \frac{V_{reflected}}{V_{incident}}$$

$$\Gamma_s = \frac{Z_s - Z_o}{Z_s + Z_o} = \frac{V_{reflected}}{V_{incident}}$$

Voltage Bounce Values $$V_1^+ = V_s \left( \frac{Z_o}{Z_o + Z_s} \right)$$

$$V_1^- = \Gamma_L * V_1^+$$

$$V_2^+ = \Gamma_s * V_1^-$$

$$V_2^- = \Gamma_L * V_2^+$$

$\vdots \quad \downarrow \quad \vdots$

Reflection Coefficients $$\Gamma_L = \frac{50\Omega - 45\Omega}{50\Omega + 45\Omega} = 0.05$$

$$\Gamma_s = \frac{50\Omega - 45\Omega}{50\Omega + 45\Omega} = 0.05$$

FIG. 5C

Voltage Bounce Values $$V_1^+ = 1V\left(\frac{45\Omega}{45\Omega + 50\Omega}\right) = 0.474\ V$$

SYSTEMS AND METHODS FOR IN-SILICON MEASUREMENT OF PRINTED CIRCUIT BOARD (PCB) TRACE IMPEDANCE

FIELD

This invention relates generally to information handling systems and, more particularly, to trace impedance of printed circuit boards (PCBs) in information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

PCB trace impedance plays a critical role in the integrity of high-speed electrical signal waveforms on system level boards used in information handling systems. Reflections will occur during system operations if the trace impedance does not match the source impedance and, if the rise time is fast enough, these reflection will affect the signal to noise ratio and cause erroneous results. During conventional PCB manufacture methods, an attempt is made to fabricate conventional system level PCBs to meet a specified stackup. The impedance of various PCB traces is specified in the stackup to be within a certain defined tolerance. However, no cost-effective method exists that may be performed during and post PCB assembly to verify that the trace impedance of individual system level PCBs meets the specified trace impedance tolerance.

Companies that produce system level boards need to verify the trace impedance of PCBs. In an attempt to do so it is common to measure the trace impedance of only a small portion (a few samples) of all manufactured PCBs using an expensive time domain reflectometer (TDR) machine, and to assume that all similar PCBs were manufactured to have the same or similar trace impedance as were the portion of PCBs that were tested. However, TDR machines are expensive and the process of obtaining TDR measurements is typically manual and time-consuming, requiring the PCB traces to have no component present during measurement (i.e., testing must be performed with a bare fab). Moreover, as with any manual process there exists the possibility of human error. There is also a significant risk with this common approach as it only validates a few PCB samples out of an entire batch, and assumes there was no change in the fabrication process from individual PCB to other individual PCBs. But there are many possible fabrication variations that may occur between different PCBs, such as use of different board etching machines for etching different batches of PCBs, use of the wrong material for etching some PCBs, variations in the source of PCB materials (e.g., dielectric, copper, etc.) used to fabricate different PCBs, etc. These fabrication variations can result in manufacture of some PCBs that violate the specified trace impedance tolerance and therefore vary in performance from other similar PCBs.

The root cause of erroneous performance and resulting errors observed during operation of an information handling system must be investigated to eradicate the errors, and time is required to determine the root cause of such problems. Where the root cause of the erroneous system performance is determined to be related to signal integrity, then incorrect trace impedance of a system board is always a possible culprit. However, there is no time and cost-efficient procedure that may be performed to validate the correct trace impedance of an assembled system level board.

During system operation, poorly controlled system board trace impedance is known to cause non-monotonic edges, create overshoot/undershoot, increase jitter, affect pulse width, cause ringing, and other problems. These problems may cause functional failures within the board electrical communication path such as packet drops, CRC or LDPC errors, and at a minimum decrease the board signal performance so that it does not provide the signal performance margin that is required by a given protocol specification. This is a cause for concern regarding the stability and robustness of any given information handling system.

Some integrated circuits (ICs) execute firmware that can be used to change IC termination impedance.

SUMMARY

Disclosed herein are systems and methods that may be implemented to provide on-board trace impedance testing for system level boards for information handling systems. Because a printed circuit board (PCB) of the system level board includes built-in test trace circuitry that may be used to measure board trace impedance, the trace impedance of a fully assembled system level board may be tested and verified for compliance with trace impedance specification, and without requiring any disassembly of the board. In a further embodiment, a programmable integrated circuit of an assembled system board may be provided with integrated circuitry (e.g., in-silicon circuitry) that is enabled to automatically execute its own impedance check (e.g., using a built-in test program) on the built-in PCB test trace circuitry of the fully assembled board, and then to tune its termination (source and/or destination) impedance accordingly to minimize signal reflections in the test trace circuitry. Thus, in one embodiment the root cause of a signal integrity issue associated with a system that includes a system board may be discovered more quickly than is conventionally possible, enabling board assemblers and manufacturers to get system board products to the market more quickly and with less effort.

In one embodiment, a system board may include a PCB with test trace circuitry and a programmable integrated circuit die having logic that allows trace impedance of the PCB test trace circuitry to be remotely measured, e.g., using an automatic built-in self-test program. Examples of such system level boards include, but are not limited to, system level boards implementing logic and circuitry for a switch, central processing unit (CPU), retimer, physical layer (PHY), medium access control layer (MAC), etc. This capability for built-in trace impedance testing may be implemented to increase the speed of testing during system board manufacturing and debugging, as well as to increase the robustness of a high-speed signal-enabled information handling system. Moreover, the ability to remotely check trace impedance may be employed to reduce debug time.

In one embodiment, a programmable integrated circuit may be developed and manufactured by a silicon company to include circuitry configured to measure trace impedance of PCB test trace circuitry and to store the measured trace impedance value in a register value of the programmable integrated circuit. This measured trace impedance value may then be used to debug observed signal integrity issues observed on an information handling system or on a system level board component. To accomplish system level debugging, the register value may be retrieved from the programmable integrated circuit register (e.g., by a system assembler or manufacturer) and reported in one embodiment to the manufacturer of the programmable integrated circuit die who may determine the trace impedance value (e.g., and provide it to the system assembler or manufacturer).

The disclosed systems and methods may be implemented in one embodiment to allow a company that makes system level boards to verify the trace impedance of their boards in a cost effective manner, by providing a quick way to check that PCB trace impedance is within tolerance when signal integrity problems arise, and without requiring or modifying an assembled system board (i.e., without removing connectors, ball grid arrays (BGAs), etc.) to validate out the trace impedance. Such modification is undesirable because it affects the integrity, variability and control of the device under test (DUT).

In one respect, disclosed herein is a system board, including: a printed circuit board (PCB) including a first signal trace having an unknown impedance ($Z_t$), the first signal trace defining a first electrically conductive circuit path between a first node and a second node of the PCB; a first impedance element having a known impedance value ($Z_L$) electrically coupled in series in the first electrically conductive circuit path between the first node and the second node; and a programmable integrated circuit mechanically attached and electrically coupled to the PCB, the programmable integrated circuit defining an integrated second electrically conductive circuit path between the first and second nodes, the second electrically-conductive circuit path including a known source impedance ($Z_S$). The programmable integrated circuit may be programmed to: provide a voltage pulse from the second electrically conductive signal path through the source impedance ($Z_S$) and first node to the first electrically conductive signal path, and then sample multiple voltage values over time at a third node positioned between the source impedance ($Z_S$) and the first impedance while the voltage at the third node is responding to a voltage waveform created by the voltage pulse, the sampled multiple voltage values being indicative of magnitude of the unknown impedance ($Z_t$) of the first signal trace.

In another respect, disclosed herein is an information handling system, including: a host programmable circuit mechanically attached and electrically coupled to a printed circuit board (PCB), the PCB including a first signal trace having an unknown impedance ($Z_t$) and defining a first electrically conductive circuit path between a first node and a second node of the PCB, and one or more additional signal traces separate from the first signal trace, each of the additional signal traces being coupled to other circuitry of the programmable integrated circuit and having the same unknown impedance ($Z_t$) as the first signal trace; and at least one of system storage or system memory coupled to the other circuitry of the host programmable integrated circuit by at least one of the additional signal traces. A first impedance element having a known impedance value ($Z_L$) may be electrically coupled in series in the first electrically conductive circuit path between the first node and the second node. The programmable integrated circuit may define an integrated second electrically conductive circuit path between the first and second nodes, the second electrically-conductive circuit path including a known source impedance ($Z_S$). The programmable integrated circuit may be programmed to: provide a voltage pulse from the second electrically conductive signal path through the source impedance ($Z_S$) and first node to the first electrically conductive signal path, and then sample multiple voltage values over time at a third node positioned between the source impedance ($Z_S$) and the first impedance while the voltage at the third node is responding to a voltage waveform created by the voltage pulse, the sampled multiple voltage values being indicative of magnitude of the unknown impedance ($Z_t$) of the first signal trace.

In another respect, disclosed herein is a method, including: executing logic on a programmable integrated circuit, the programmable integrated circuit mechanically attached and electrically coupled to a PCB. The PCB may include a first signal trace having an unknown impedance ($Z_t$), the first signal trace defining a first electrically conductive circuit path between a first node and a second node of the PCB, and a first impedance element having a known impedance value ($Z_L$) electrically coupled in series in the first electrically conductive circuit path between the first node and the second node. The programmable integrated circuit may define an integrated second electrically conductive circuit path between the first and second nodes, the second electrically-conductive circuit path including a known source impedance ($Z_S$). The method may further include using the programmable integrated circuit to: provide a voltage pulse from the second electrically conductive signal path through the source impedance ($Z_S$) and first node to the first electrically conductive signal path, and then sample multiple voltage values over time at a third node positioned between the source impedance ($Z_S$) and the first impedance while the voltage at the third node is responding to a voltage waveform created by the voltage pulse, the sampled multiple voltage values being indicative of magnitude of the unknown impedance ($Z_t$) of the first signal trace.

BRIEF DESCRIPTION OF THE DRAWINGS

FIG. 5C illustrates reflection coefficients for a source impedance and a load resistor of an impedance-measuring circuit according to one exemplary embodiment of the disclosed systems and methods.

FIG. 5D illustrates voltage bounce values according to one exemplary embodiment of the disclosed systems and methods.

DESCRIPTION OF ILLUSTRATIVE EMBODIMENTS

Figure 1:
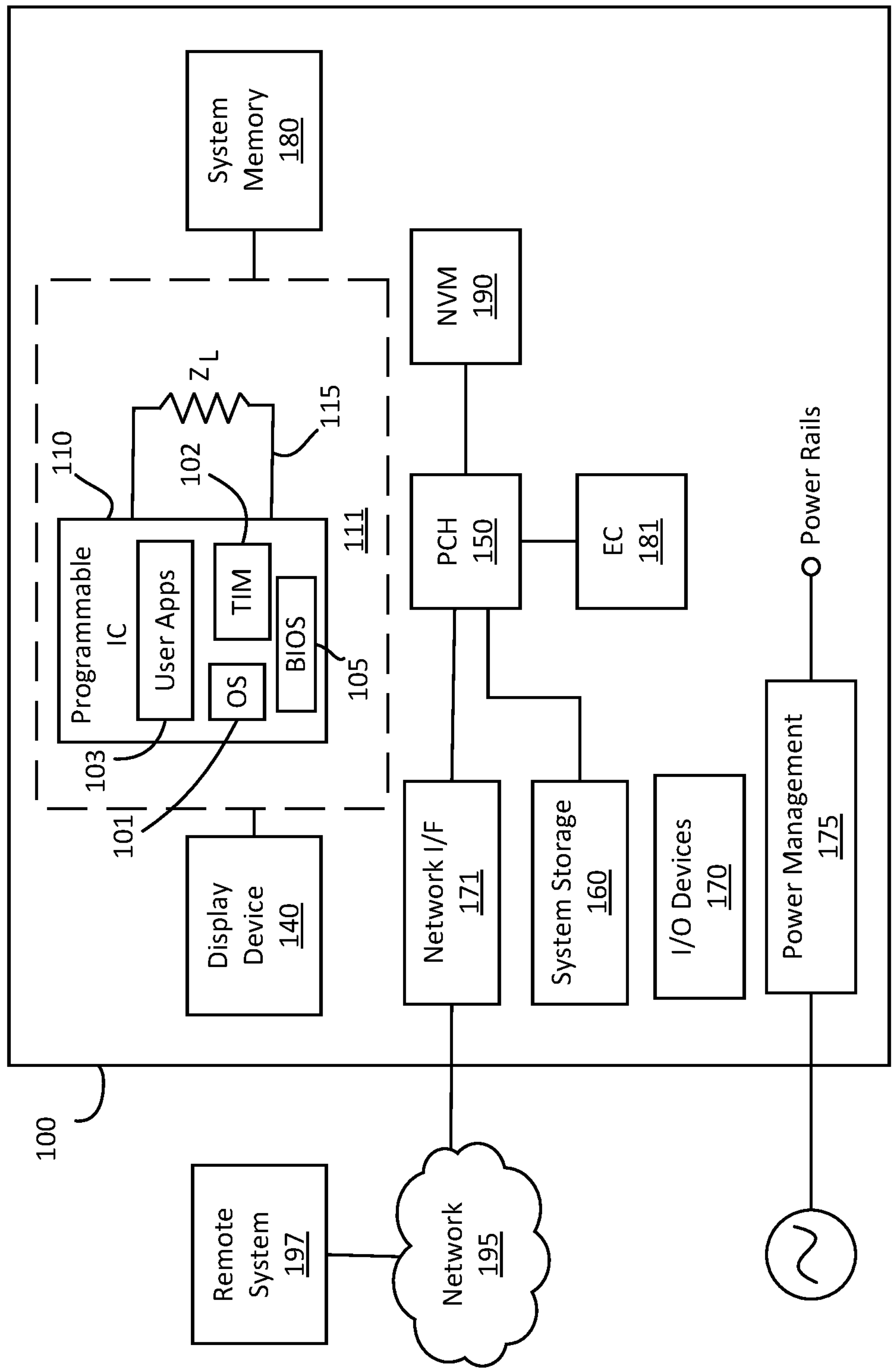
FIG. 1 illustrates a block diagram of an information handling system according to one exemplary embodiment of the disclosed systems and methods.

FIG. 1 is a block diagram of an information handling system 100 (e.g., a desktop computer, tower computer, laptop computer, tablet computer, etc.) as it may be configured according to one embodiment of the disclosed systems and methods. In this regard, it should be understood that the configuration of FIG. 1 is exemplary only, and that the disclosed methods may be implemented on other types of information handling systems. In one embodiment, all of the components of information handling system 100 may be contained within a system chassis enclosure (e.g., sheet metal and/or plastic case) as shown by the solid line enclosing these components in FIG. 1. It should be further understood that while certain components of an information handling system are shown in FIG. 1 for illustrating embodiments of the disclosed systems and methods, the information handling system is not restricted to including only those components shown in FIG. 1 and described below.

As shown in FIG. 1, information handling system 100 may generally include a system board 111 that includes a host programmable integrated circuit 110 mounted to a printed circuit board (PCB), with the host programmable integrated circuit 110 executing an operating system (OS) 101 (e.g., proprietary OS such as Microsoft Windows 10, open source OS such as Linux OS, etc.) and other code including one or more user applications 103 and basic input/output system (BIOS) 105. As shown, host programmable integrated circuit 110 is also configured with built-in hardwired trace impedance measurement (TIM) logic 102 and other associated in-silicon circuitry described further herein. As shown in FIG. 1, trace impedance measurement logic 102 is electrically coupled to at least one electrically-conductive test signal trace 115 and associated circuitry illustrated and described further in FIG. 2A.

In FIG. 1, host programmable integrated circuit 110 may be configured to access system storage 160 and non-volatile memory 190 (e.g., serial peripheral interface (SPI) Flash memory) to load and boot part of a system basic input/output system (BIOS). Host programmable integrated circuit 110 may include any type of processing device, such as an Intel central processing unit (CPU), an Advanced Micro Devices (AMD) CPU or another programmable integrated circuit. Host programmable integrated circuit 110 may also be coupled to volatile system memory 180, which may include, for example, random access memory (RAM), dynamic RAM (DRAM), synchronous DRAM (SDRAM).

In the illustrated embodiment, host programmable integrated circuit 110 may also be coupled to an external or internal (integrated) display device 140 (e.g., LCD or LED display or other suitable display device) depending on the particular configuration of information handling system 100. In such an embodiment, integrated graphics capability may be implemented by host programmable integrated circuit 110 to provide visual images (e.g., a graphical user interface, static images and/or video content) to a system user. However, in other embodiments, a separate programmable integrated circuit (e.g., such as graphics processor unit "GPU") may be coupled between host programmable integrated circuit 110 and display device 140 to provide graphics capability for information handling system 100. In one embodiment, display device 140 may be integrated within a system chassis of information handling system 100, although display device 140 may be a separate discrete component outside the system chassis enclosure that is coupled by a data bus to components of the information handling system 100 within the system chassis enclosure.

In one embodiment, optional platform controller hub (PCH) 150 may be present as shown to control certain data paths and to manage information flow between components of the information handling system 100. As such, PCH 150 may include one or more integrated controllers or interfaces for controlling the data paths connecting PCH 150 with host programmable integrated circuit 110, local system storage 160, internal (integrated) or external input/output (I/O) devices 170 (e.g., keyboard, mouse, trackpad, etc.) forming at least a part of a user interface for the information handling system, network interface (I/F) device 171, embedded controller (EC) 181, and NVM 190, e.g., where BIOS firmware image and settings may be stored together with other components including ACPI firmware, etc. In one embodiment, PCH 150 may include a Serial Peripheral Interface (SPI) controller and an Enhanced Serial Peripheral Interface (eSPI) controller. In some embodiments, PCH 150 may include one or more additional integrated controllers or interfaces such as, but not limited to, a Peripheral Controller Interconnect (PCI) controller, a PCI-Express (PCIe) controller, a low pin count (LPC) controller, a Small Computer Serial Interface (SCSI), an Industry Standard Architecture (ISA) interface, an Inter-Integrated Circuit ($I^2C$) interface, a Universal Serial Bus (USB) interface and a Thunderbolt™ interface. It will be understood that in other embodiments, components of information handling system 100 may be coupled together and to host programmable integrated circuit 110 without the presence of PCH 150 (e.g., using any suitable combination of interfaces, data buses, etc.)

In the embodiment of FIG. 1, I/O devices 170 may be coupled to PCH 150 of system 100 to enable the system end user to input data and interact with information handling system 100, and to interact with application programs or other software/firmware executing thereon. The network I/F device 171 enables wired and/or wireless communication with remote information handling systems 197 via an external network 195 (e.g., the Internet), and in one embodiment may be a network interface controller (NIC) which may communicate with an external network across an intervening local area network (LAN), wireless LAN (WLAN), cellular network, etc. Local system storage 160 (e.g., one or more media drives, such as hard disk drives, optical drives, NVRAM, Flash memory, solid state drives (SSDs), or any other suitable form of internal or external storage) may be coupled as shown through PCH 150 to provide non-volatile storage for information handling system 100.

A power source for the information handling system 100 may be provided via an external power source (e.g., mains power) and an internal power supply regulator, and/or by an internal power source, such as a battery. As shown in FIG. 1, power management system 175 may be included within information handling system 100 for moderating the available power from the power source. In one embodiment, power management system 175 may be coupled to provide operating voltages on one or more power rails to one or more components of the information handling system 100 (including host programmable integrated circuit 110), as well as to perform other power-related administrative tasks of the information handling system.

Embedded controller (EC) 181 is coupled to PCH 150 and may be configured to perform functions such as power/thermal system management, etc. EC 181 may also be configured to execute program instructions to boot information handling system 100, load application firmware from NVM 190 into internal memory, launch the application firmware, etc. In one example, EC 181 may include a processing device for executing program instructions to perform the above stated functions. Although not strictly limited to such, processing device of EC 181 may be implemented as a programmable integrated circuit (e.g., a controller, microcontroller, microprocessor, ASIC, etc., or as a programmable logic device "PLD" such as FPGA, complex programmable logic device "CPLD", etc.).

Figure 2A:
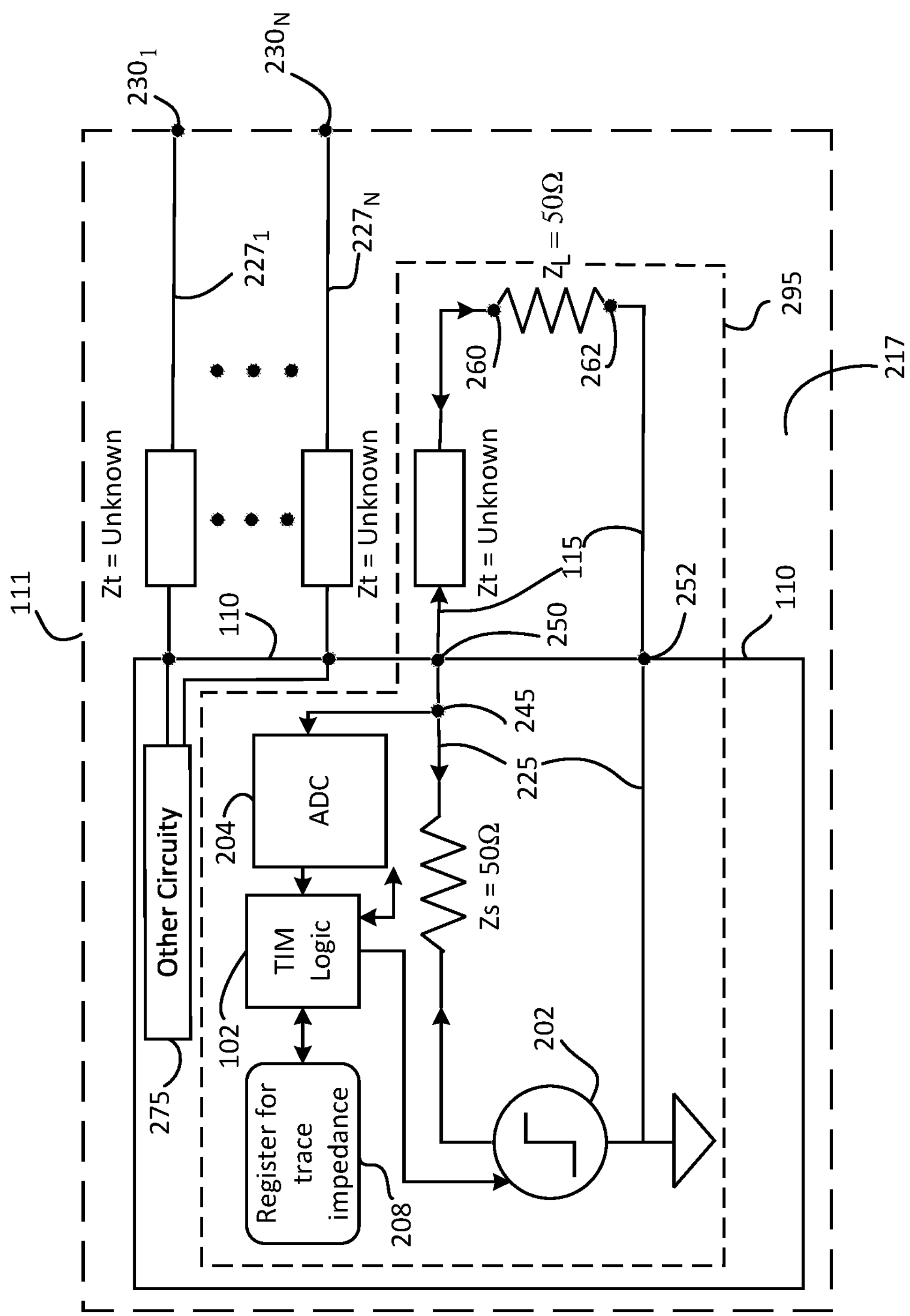
FIG. 2A illustrates a block diagram of a system level board according to one exemplary embodiment of the disclosed systems and methods.

FIG. 2A illustrates one exemplary embodiment of system board 111 that includes a PCB 217 (e.g., silicon, polyimide, or FR4 board) that includes electrically-conductive test trace 115 (e.g., copper, copper alloy, etc.). As shown host programmable integrated circuit 110 is mounted or otherwise mechanically attached and electrically coupled to the PCB (e.g., with ball grid array (BGA), pin grid array (PGA) or other surface mount technology (SMT)) to form the system board 111. In one exemplary embodiment, the host programmable integrated circuit 110 may be a CPU chip including a BGA that is received within a BGA socket of the system board 111, which may be a motherboard. However, it will be understood that the disclosed systems and methods may be similarly implemented using other types of programmable integrated circuits executing TIM logic 102 to perform on-board trace impedance testing on other types of system board circuitry, e.g., such as a graphics card including a graphics processing unit (GPU), a motherboard or network interface card including a network interface controller 171 executing PHY and MAC processing, a retimer board including a retimer integrated circuit such as a PCIe retimer circuit, a Ethernet switch or other type of data switch card including a programmable integrated circuit, etc.

Still referring to FIG. 2A, electrically-conductive test trace 115 defines a circuit path on PCB 217 that is coupled between nodes 250 and 252 of host programmable integrated circuit 110. Test trace 115 is formed as a signal trace using the same process, and of the same conductive material and trace cross-sectional dimensions (trace width and trace thickness), as other signal traces 227$_1$ to 227$_N$ on PCB 217 that are coupled between other circuitry 275 (e.g., clock circuit, data input and output/s, etc.) of host programmable integrated circuit 110 and respective system board connections 230$_1$ to 230$_N$. System board connections 230$_1$ to 230$_N$ in turn may be coupled as shown in FIG. 1 to other (off-board) circuitry of information handing system 100, such as system memory 180, PCH 150, etc.

As shown in FIG. 2A, test trace 115 has an unknown trace impedance ($Z_t$). Since other signal traces 227$_1$ to 227$_N$ on PCB 217 are formed using the same process, and have the same material, trace width and trace thickness as test trace 115, they each have the same unknown impedance $Z_t$ as test trace 115. An impedance element in the form of a termination resistor $Z_L$ of known fixed impedance is electrically coupled in series within test trace 115 between nodes 260 and 262. The impedance of termination resistor $Z_L$ is selected to match the intended (e.g., specified) target trace impedance for other signal traces 227$_1$ to 227$_N$ which is defined by PCB manufacturing schematic/PCB design/stackup specifications. In the embodiment of FIG. 2A, resistive element $Z_L$ has an example known impedance of 50Ω, it being understood that this impedance value is exemplary and used here only for purposes of illustration.

As further shown in FIG. 2A, an internal electrically conductive source circuit path 225 is defined (integrated) within the silicon architecture of the host programmable integrated circuit 110 and includes a signal generator 202, and a series source impedance $Z_S$ of known impedance (e.g., 50Ω) to provide a source impedance that matches the intended target trace impedance of this example. In one embodiment, source impedance $Z_S$ may be a controlled source impedance that is designed into the silicon of host programmable integrated circuit 110. Terminal ends of internal source in-silicon circuit path 225 are coupled to respective legs of test trace 115 at nodes 250 and 252 of host programmable integrated circuit 110 as shown. Other illustrated components defined in the silicon architecture of the host programmable integrated circuit 110 include analog-to-digital converter (ADC) 204 that is controlled by TIM 102 and that is coupled to one leg of internal source in-silicon circuit path 225 at node 245 between source impedance $Z_S$ and node 250 as shown. In one embodiment, ADC 204 may have a resolution better than 5 mV, a bandwidth (i.e., sampling rate) greater than 6 GHz. Trace impedance measurement logic 102 is coupled between ADC 204 and register 208 that is provided for storing measured trace impedance values received from TIM 102. Trace impedance measurement logic 102 is also coupled to control signal generator 202 as shown. Together, components 102, 115, 202, 204, 208, 225, together with impedances $Z_S$ and $Z_L$, form an impedance-measuring circuit 295 on system board 111, in this case for measuring 50 ohm trace impedance.

Figure 3:
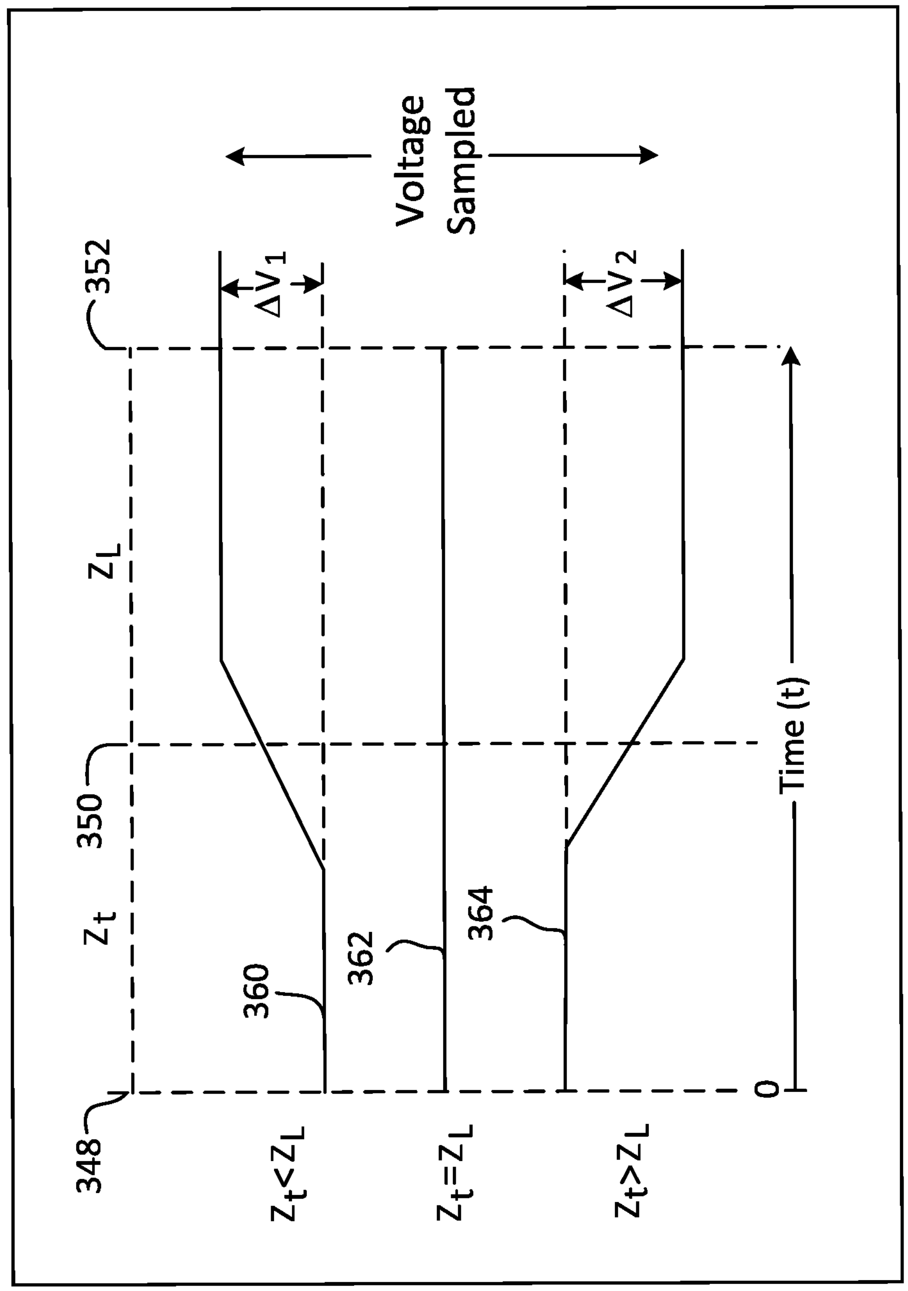
FIG. 3 illustrates a voltage waveform according to one exemplary embodiment of the disclosed systems and methods.

In one embodiment, TIM 102 controls signal generator 202 to send a voltage pulse wave with known rise time and amplitude (e.g., 50 millivolts) through the impedance-measuring circuit 295 (including circuit path 225 and test trace 225) to create the voltage waveform shown in FIG. 3 within impedance-measuring circuit 295. At the same time, TIM 102 controls ADC 204 to continuously sample voltage at node 245 at a predefined given sample rate (e.g., such as per every $\frac{1}{6}^{th}$ nanoseconds) that is selected to have sufficient resolution to capture a predefined voltage or voltage range of the created voltage waveform (e.g., +/−10% centered on the voltage of the pulse wave) for a predefined set duration of time (e.g., such as 0.005 seconds). In this way, the combination of given sampling rate and sampling time duration may be selected to capture the voltage waveform created within impedance-measuring circuit 295. ADC 204 provides the resulting voltage samples of the voltage waveform to TIM 102, which in this embodiment is programmed to calculate a trace impedance value or trace impedance value range from the resulting sampled waveform as described further herein.

Trace impedance measurement logic 102 of FIG. 2A may be implemented in any suitable manner and using any suitable combination of hardwired circuitry and/or programmable logic (e.g., firmware and/or software). For example, in one exemplary embodiment, trace impedance measurement logic 102 may be implemented on host programmable integrated circuit 110 by programmable dataset/s that may be stored locally (e.g., in NVM 190 or flash memory) and loaded in on bring-up or during manufacture Power-On-Self-Test (POST). In another embodiment, such programmable dataset/s may be one or more of programmed, updated, refined, and/or checked remotely, e.g., such as from a remote system 197 across network 195.

In one exemplary embodiment, trace impedance measurement logic 102 may be hardwired on host programmable integrated circuit 102 and coupled to an ADC 204 that is implemented as a flash ADC (i.e., direct-conversion ADC), e.g., having two comparators and corresponding reference voltages. In one exemplary embodiment, these two comparators of a flash ADC 204 may be implemented with a reference voltage to determine if the trace impedance value of a manufactured system level board 111 is within or outside of a predefined stackup impedance specification value. In another exemplary embodiment multiple comparators may be employed in parallel to increase accuracy and used to determine the actual trace impedance value of a manufactured system level board 111. Sampling time/s (i.e., when or at what time to sample the outputs of the comparators) may also be programmable and stored (e.g., in NVM 190 or flash memory).

In one embodiment, source impedance ($Z_S$) of a step pulse $V_S$ described further herein may be hardwired (e.g., on die), but in other embodiments it is possible to choose and/or program the value of source impedance ($Z_S$) from multiple predefined set impedance values. Reference voltages for the comparators may in one embodiment be programmed using selectable output regulators. In such an embodiment, these reference voltages may be programmed to correspond to a maximum voltage difference threshold ($\Delta V_{TH}$) described further herein that may be used to determine a range of trace impedance ($Z_t$) magnitude, e.g., so as to determine whether trace impedance ($Z_t$) is within or outside of a predefined stackup impedance specification value.

Figure 2B:
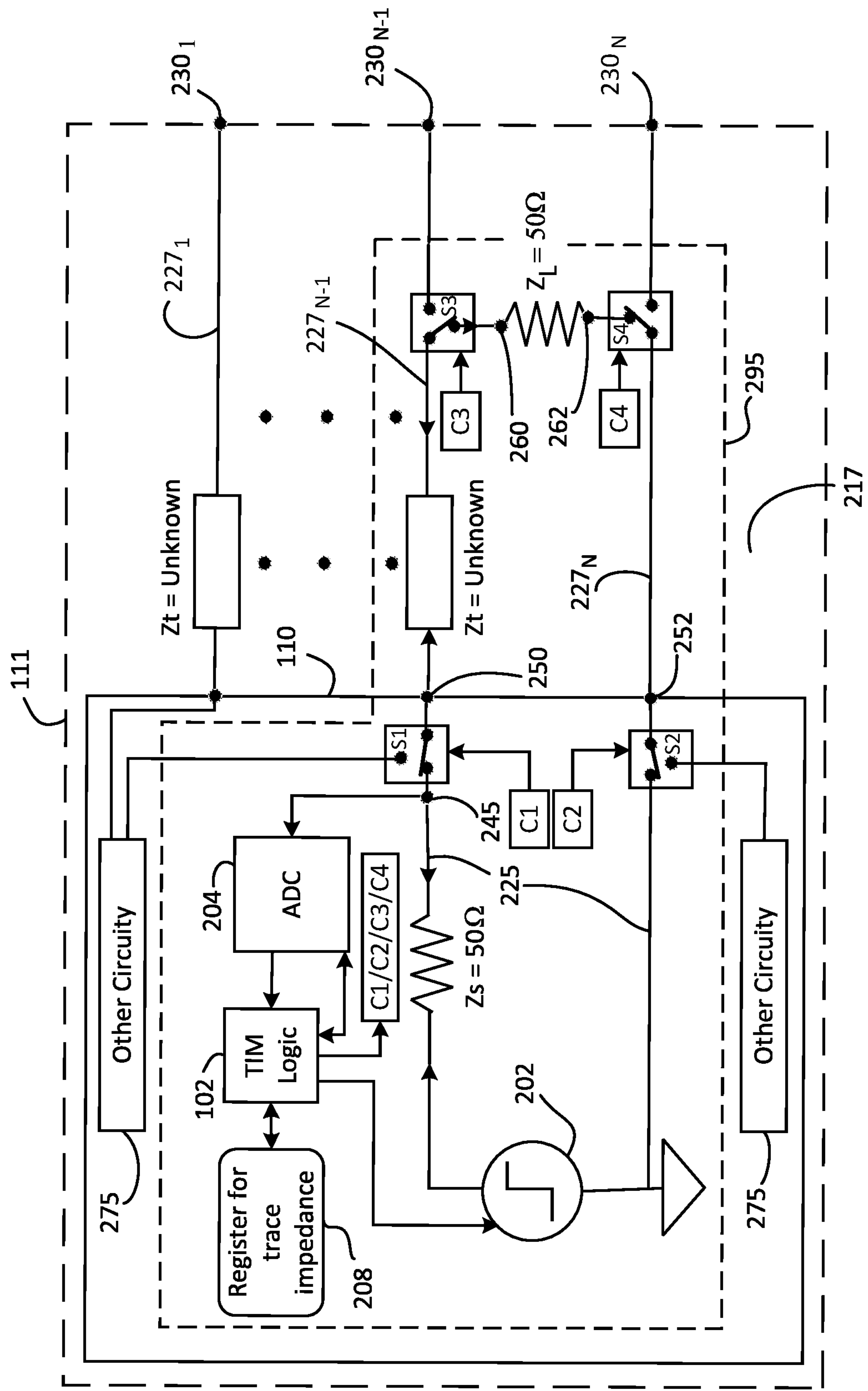
FIG. 2B illustrates a block diagram of a system level board according to one exemplary embodiment of the disclosed systems and methods.

FIG. 2B illustrates an alternative embodiment of a system level board 111 that is similar to system level board 111 of FIG. 2A but that employs a portion of other signal traces 227 on PCB 217 as an impedance test trace when needed (rather than using a dedicated impedance test trace 115 on PCB 217). In the embodiment of FIG. 2B, an impedance-measuring circuit 296 is selectively enabled by using a portion of other signal traces $\mathbf{227}_{N-1}$ and $\mathbf{227}_N$ as a test trace for on-board trace impedance testing. In FIG. 2B, switching circuitry is provided that in this embodiment includes four switches S1, S2, S3 and S4 that are controlled by TIM logic 102 using respective control signals C1, C2, C3 and C4 to selectably electrically couple signal generator 202 and load impedance $Z_L$ to other signal traces $\mathbf{227}_{N-1}$ and $\mathbf{227}_N$ in a first switch setting as shown. At the same time, in this first switch setting the switches S1, S2, S3 and S4 electrically decouple other signal traces $\mathbf{227}_{N-1}$ and $\mathbf{227}_N$ from respective off-board system board connections $\mathbf{230}_{N-1}$ and $\mathbf{230}_N$ and other circuitry 275 (e.g., clock circuit, data input and output/s, etc.) of host programmable integrated circuit 110. While impedance-measuring circuit 296 is so enabled by the first switch setting, on-board impedance testing may be performed in similar manner as described herein for the dedicated test trace 115 of impedance-measuring circuit 295 of FIG. 2A. After impedance testing, TIM logic 102 may control switches S1, S2, S3 and S4 of the switching circuitry using control signals C1, C2, C3 and C4 to implement a second and different switch setting that electrically couples the same other signal traces $\mathbf{227}_{N-1}$ and $\mathbf{227}_N$ to (and between) respective system board connections $\mathbf{230}_{N-1}$ and $\mathbf{230}_N$ and other circuitry of host programmable integrated circuit 110 (while at the same time electrically decoupling signal generator 202 and load impedance $Z_L$ from other signal traces $\mathbf{227}_{N-1}$ and $\mathbf{227}_N$ in this second switch setting).

FIG. 3 illustrates three possible types of possible voltage waveforms 360, 362 and 364 that may be created versus elapsed time within impedance-measuring circuit 295 of FIG. 2A by the pulse wave of signal generator 202, and sampled by ADC 204. The relative voltage values of each of the different example voltage waveforms 360, 362 and 364 varies versus time according to difference between the transmission line trace impedance $Z_t$ relative to the known impedances of source impedance $Z_S$ and load resistor $Z_L$. In each case, the voltage pulse wave is created at time 348 corresponding to time zero. An example of the voltage pulse wave is a step pulse $V_S$ as illustrated versus time (t) in FIG. 4A. As shown in FIG. 3, the voltage magnitude of each resulting waveform 360, 362 and 364 within impedance-measuring circuit 295 varies as a function of elapsed time (t) measured from zero time 348, and varies according to the magnitude of any difference (and any resulting signal reflections) between transmission line trace impedance $Z_t$ and the load impedance $Z_L$ of the termination resistor. As described further herein, the particular characteristics of each of the particular waveforms 360, 362 and 364 is indicative of the value of transmission line trace impedance $Z_t$ relative to the value of load impedance $Z_L$ of the termination resistor.

Still referring to FIG. 3, each of the illustrated example voltage waveforms 360, 362 and 364 has two constant voltage portions. A first constant voltage portion of each example waveform corresponds to transmission line trace impedance $Z_t$ and extends from zero time 348 to intermediate time 350, and the second constant voltage portion of each example waveform corresponds to load impedance $Z_L$ and extends from intermediate time 350 to end time 352.

As shown in FIG. 3, the first and second constant voltage portions of example waveform 362 have the same voltage (i.e., waveform 362 has a constant voltage value from zero time 348 to end time 352) in the case where the transmission line trace impedance $Z_t$ is equal to the load impedance $Z_L$ of the termination resistor and little or no voltage reflections occur in the test trace 115 in response to the step pulse $V_S$. Since the impedance of termination resistor $Z_L$ is selected to match the intended target trace impedance, the constant voltage characteristic of pulse waveform 362 indicates that transmission line trace impedance $Z_t$ is equal to the target trace impedance. This in turn means that the impedance of signal traces 115 and $\mathbf{227}_1$ to $\mathbf{227}_N$ on PCB 217 meet the signal trace design impedance specifications for the PCB 217.

In FIG. 3, the second constant voltage portion of example waveform 360 (between time 350 and 352) differs from the first constant voltage portion of example waveform 360 (between times 348 and 350) by a positive voltage differential ($\Delta V_1$) in the case where transmission line trace impedance $Z_t$ is less than the impedance $Z_L$ of the termination resistor, i.e., due to voltage reflections occurring in the test trace 115 because of a discontinuity in the circuit path created by this impedance difference. When measured by ADC 204 and TIM 102, such a positive voltage differential ($\Delta V_1$) indicates that transmission line trace impedance $Z_t$ is less than load impedance $Z_L$ and thus less than the target trace impedance.

In FIG. 3, the second constant voltage portion of example waveform 364 (between time 350 and 352) differs from the first constant voltage portion of example waveform 360 (between times 348 and 350) by a negative voltage differential ($\Delta V_2$) in the case where transmission line trace impedance $Z_t$ is greater than the impedance $Z_L$ of the termination resistor, i.e., due to voltage reflections occurring in the test trace 115 because of the discontinuity in the circuit path created by this impedance difference. When measured by ADC 204 and TIM 102, such a negative voltage differential ($\Delta V_2$) indicates that transmission line trace impedance $Z_t$ is greater than load impedance $Z_L$ and thus less than the target trace impedance.

In one exemplary embodiment, the absolute value of a measured voltage differential (e.g., either positive differential $\Delta V_1$ or negative differential $\Delta V_2$ in FIG. 3) may be used as an indication of whether or not the impedance of signal trace 115 (and therefore signal traces 227$_1$ to 227$_N$) on PCB 217 meet the signal trace design impedance specification (or other specified impedance value) for the PCB 217. For example, a predefined maximum voltage difference threshold ($\Delta V_{TH}$) may be defined that corresponds to a maximum allowable threshold difference between impedance $Z_L$ of the termination resistor and the transmission line trace impedance $Z_t$ (e.g., per signal trace design specifications or other specified trace impedance value for PCB 217). In such an embodiment, any time a measured positive or negative voltage difference ($\Delta V_1$ or $\Delta V_2$) of FIG. 3 has an absolute value greater than the predefined maximum voltage difference threshold ($\Delta V_{TH}$) this is an indication that the impedance value of signal traces 115 (and traces 227$_1$ to 227$_N$) has a magnitude that does not fall within a range of acceptable trace impedance values, e.g., as defined by trace design impedance specification (or any other defined acceptable impedance value range) for the PCB 217.

Figures 4A, 4D, 4E:
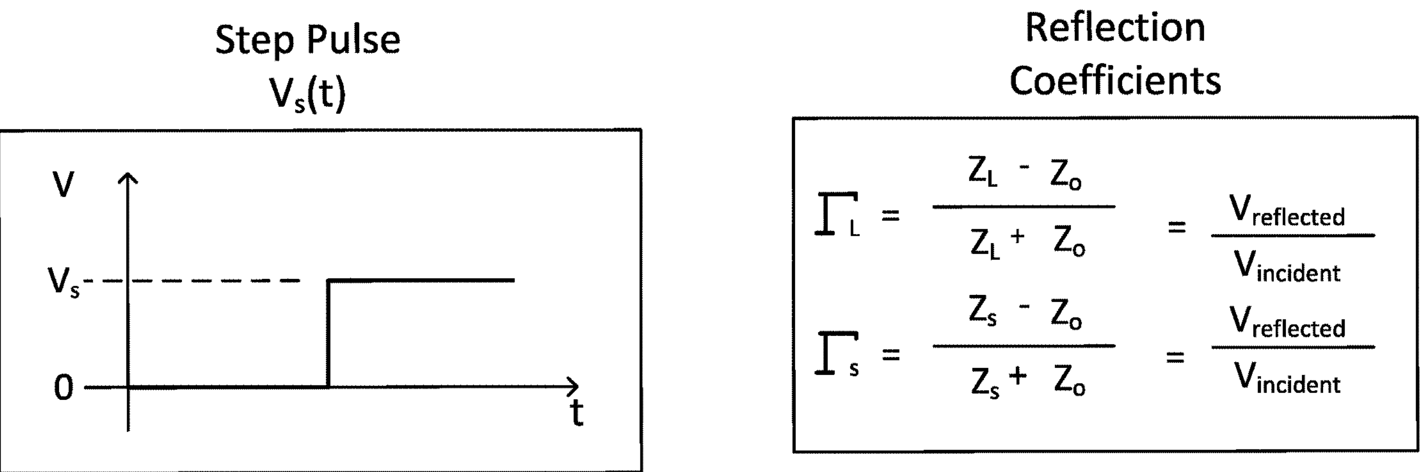
FIG. 4A illustrates a voltage pulse wave according to one exemplary embodiment of the disclosed systems and methods.
FIG. 4D illustrates reflection coefficients for a source impedance and a load resistor of an impedance-measuring circuit according to one exemplary embodiment of the disclosed systems and methods.
FIG. 4E illustrates voltage bounce values according to one exemplary embodiment of the disclosed systems and methods.
Figure 4B:
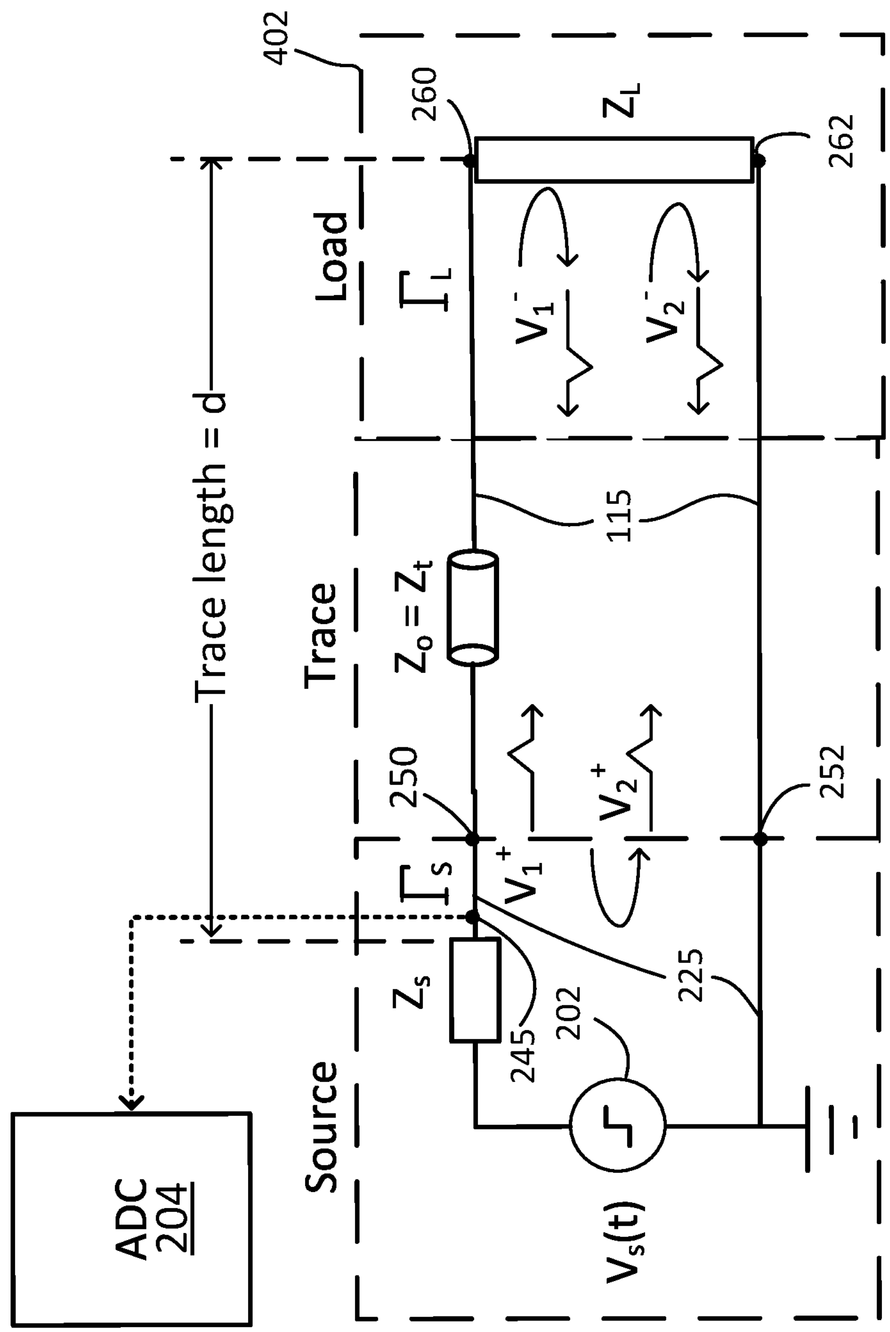
FIG. 4B illustrates an analog to digital converter (ADC) electrically coupled to components of a test path of an impedance-measuring circuit according to one exemplary embodiment of the disclosed systems and methods.

FIG. 4B is a block diagram illustrating ADC 204 coupled to components of test path 402 of impedance-measuring circuit 295 of FIG. 2A that include source circuit path 225, test trace circuit path 115, and load resistor $Z_L$. In FIG. 4B, a set trace length (d) is defined as the circuit path length between source impedance $Z_S$ and load impedance $Z_L$ of test path 402, and is used in the determination of $Z_t$ as described further herein. FIG. 4B also illustrates characteristics of a resulting pulse waveform over time when it is created in test path 402 by step pulse ($V_S$) of FIG. 4A in the case where impedance of load resistor $Z_L$ is different from impedance of source impedance $Z_S$. After creation of step pulse ($V_S$), ADC 204 samples voltage at the location of node 245, which is located at a set point between the source impedance 204 and node 250. ADC 204 samples voltage at node 245 for a specified time duration that is based on the trace length (d) and reports the sampled voltage values over time to TIM logic 102. Given the known impedance value of load impedance $Z_L$, TIM logic 102 or alternatively any other programmable integrated circuit employed for post-processing of these sample voltages (e.g., such as programmable integrated circuit of remote system 197) has a known reference with which to work to determine whether the transmission line impedance of test signal trace 115 is within or out of specification.

As shown in FIG. 4B, step pulse ($V_S$) created at time zero causes an initial voltage $V_1^+$ to be provided from source impedance $Z_S$ to test path components 402 that include source circuit path 225, test trace circuit path 115, and load resistor $Z_L$. Initial voltage $V_1^+$ travels as shown through the trace length (d) of test path components 402 in a time ($\tau$) to load resistor $Z_L$, where a first reflected voltage $V_1^-$ is generated at time ($\tau$) from load resistor $Z_L$ and travels back through the trace length (d) of test path components 402 to source impedance $Z_S$ at a time ($2\tau$). At time ($2\tau$), reflected voltage $V_1^-$ generates a second reflected voltage $V_2^+$ at source impedance $Z_S$ that travels back through the trace length (d) of test path components 402 to load resistor $Z_L$ at time ($3\tau$), where a third reflected voltage $V_2^-$ is generated from load resistor $Z_L$ at time ($3\tau$) and travels back through the trace length (d) of test path components 402 in the time ($\tau$) to source impedance $Z_S$, and so on.

Figure 4C:
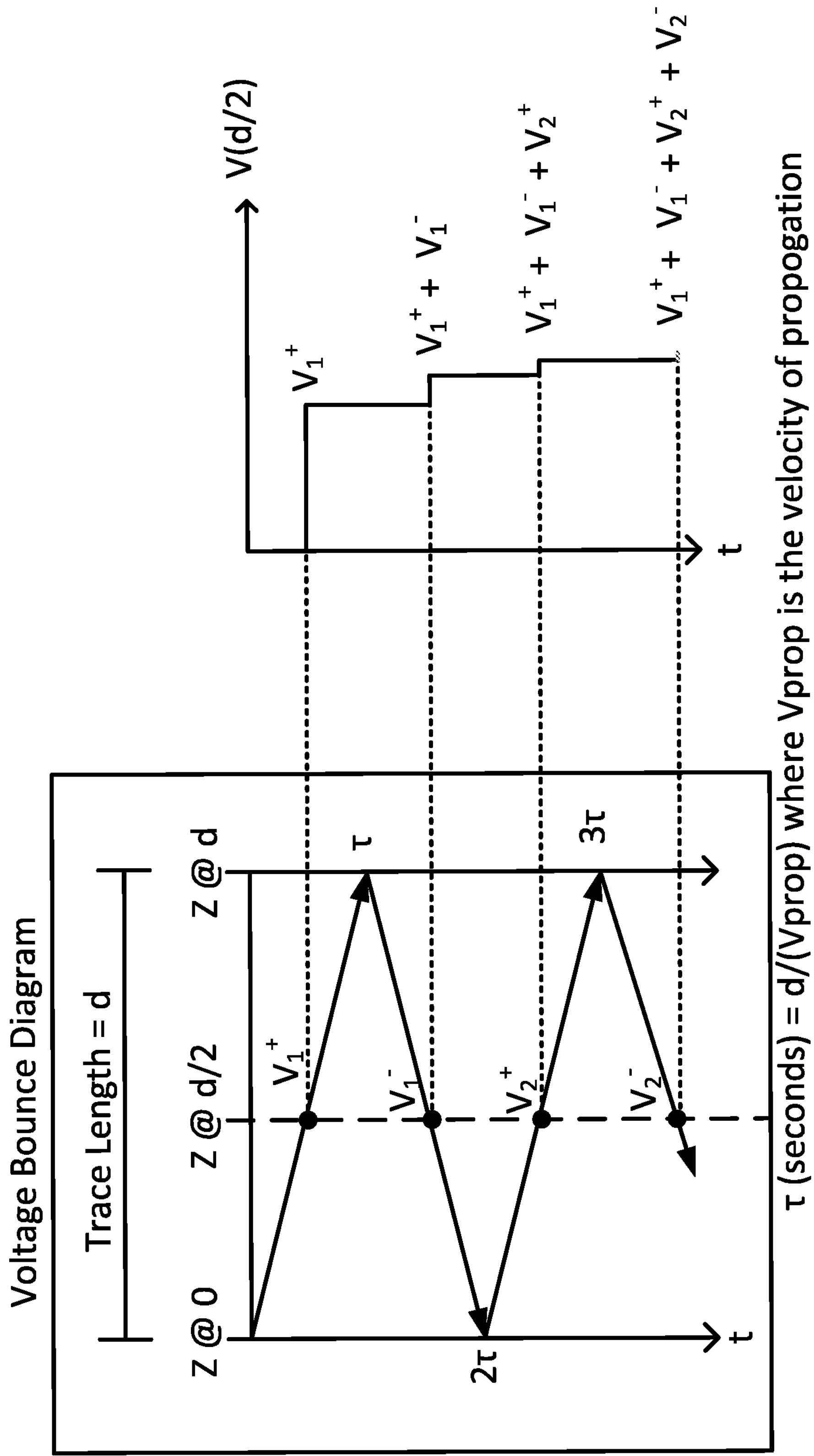
FIG. 4C illustrates a voltage bounce diagram according to one exemplary embodiment of the disclosed systems and methods.

The sequence and timing of step pulse ($V_S$) and its subsequent voltage reflections is shown in FIG. 4C, in which time ($\tau$) is equal to the trace length (d) divided by the velocity of voltage propagation through the trace length (d). Thus, the original step pulse ($V_S$), and each subsequent reflection, each occurs at an integer multiple of time ($\tau$) as shown. FIG. 4C also illustrates values of voltage versus time at a half-way point (d/2) of trace length (d) between source impedance $Z_S$ and load resistor $Z_L$ as the original step pulse ($V_S$) and each subsequent reflection travels the length of trace length (d). Thus, at time ($\tau/2$) voltage at (d/2) is equal to a voltage bounce value of $V_1^+$ at ($\tau/2$), at time $1.5\tau$ voltage at (d/2) is equal to a voltage bounce value of $V_1^+ + V_1^-$, at time $2.5\tau$ voltage at (d/2) is equal to a voltage bounce value of $V_1^+ + V_1^- + V_2^+$, at time $3.5\tau$ voltage at (d/2) is equal to a voltage bounce value of $V_1^+ + V_1^- + V_2^+ + V_2^-$, etc.

FIG. 4D illustrates equations that express the relationship between each of reflection coefficient ($\Gamma_S$) for source impedance $Z_S$ and reflection coefficient ($\Gamma_L$) for load resistor $Z_L$ of impedance-measuring circuit 295, and the impedance values of source impedance $Z_S$, load resistor $Z_L$ and the unknown impedance value ($Z_O = Z_t$) of impedance-measuring circuit 295. FIG. 4E illustrates equations that express the relationship between reflection coefficients ($\Gamma_S$) and ($\Gamma_L$), and the corresponding measured voltage bounce values $V_1^+$, $V_1^-$, $V_2^+$, $V_2^-$, etc. of FIG. 4C. In one exemplary embodiment, these reflection coefficient equations may be used to determine the unknown impedance value ($Z_O = Z_t$) using measured values of $V_1^+$, $V_1^-$, $V_2^+$, $V_2^-$, etc. In another embodiment, these reflection coefficient equations may be used to determine a maximum voltage difference threshold ($\Delta V_{TH}$) value corresponding to a selected maximum allowable impedance value difference between the source impedance $Z_S$ and the actual trace impedance ($Z_O = Z_t$).

Figure 5A:
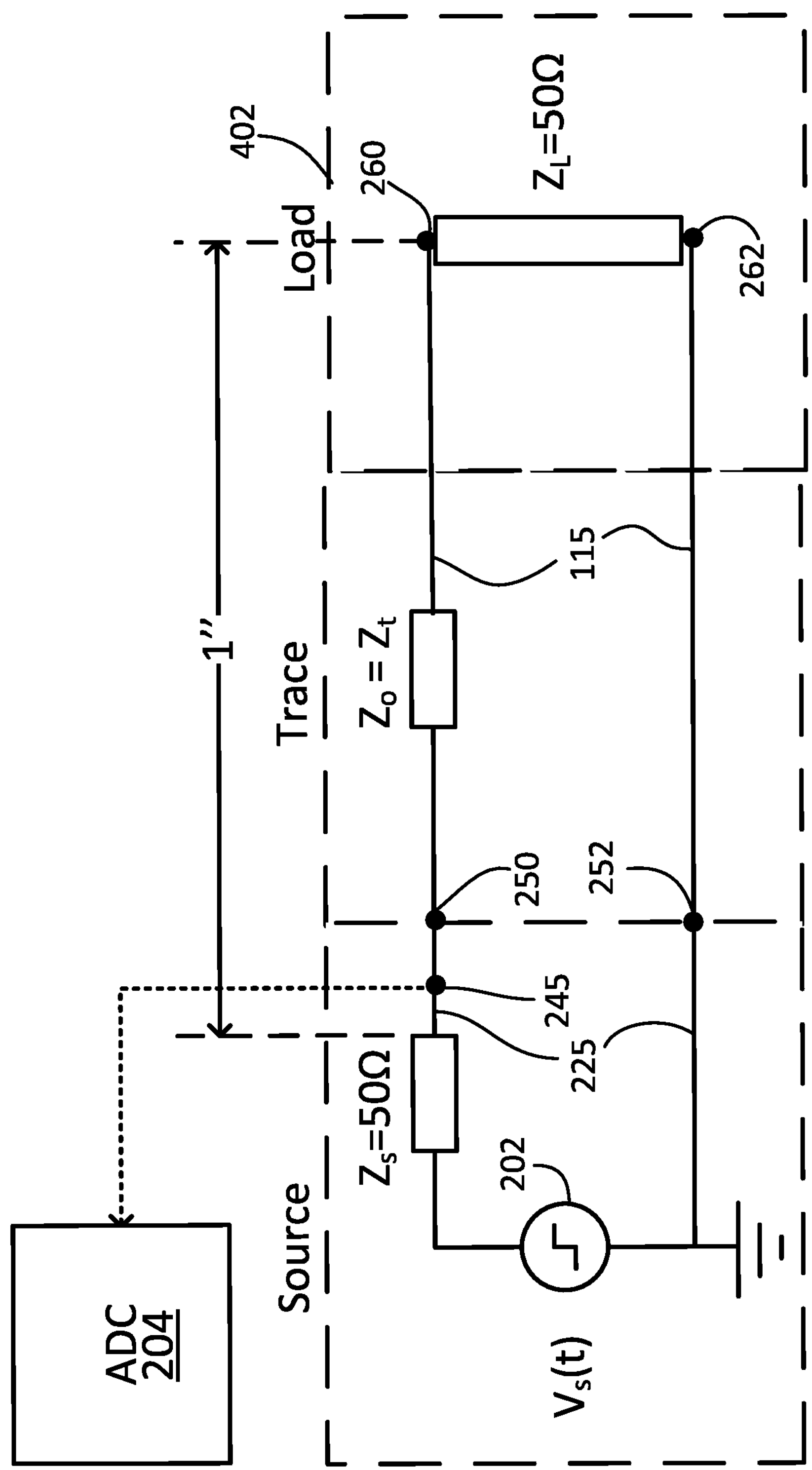
FIG. 5A illustrates an analog to digital converter (ADC) electrically coupled to components of a test path of an impedance-measuring circuit according to one exemplary embodiment of the disclosed systems and methods.
Figure 6:
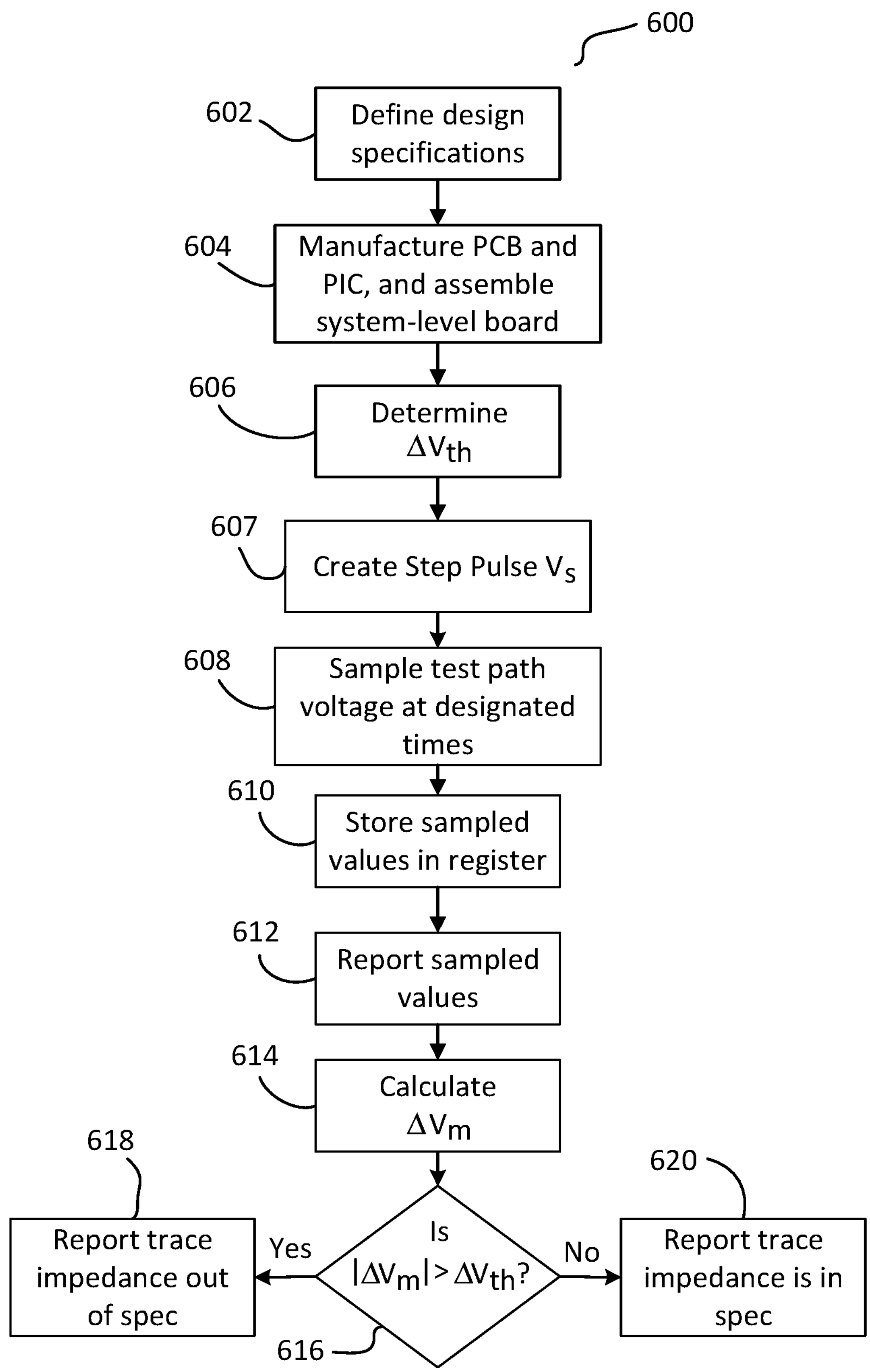
FIG. 6 illustrates methodology according to one exemplary embodiment of the disclosed systems and methods.

FIG. 5A is a block diagram illustrating a one exemplary embodiment of test path components 402 that may be implemented as part of a system-level board impedance-measuring circuit 295 of a system-level board 111 such as illustrated in FIG. 2A. FIG. 6 illustrates one embodiment of an on-board trace impedance testing methodology 600 that may be employed for such a system-level board 111 using these circuit path components of FIG. 5A. However, it will be understood that methodology 600 may be employed for system-level boards 111 having other configurations of test path components.

As shown, methodology 600 begins in step 602 where design specifications for a programmable integrated circuit 110 and PCB 217 of a system-level board 111 of FIG. 2A are defined. The PCB design specifications include layout and target impedance for test signal trace 115 and other signal traces 227 of test path components 402. The impedance of termination resistor $Z_L$ is selected to match the intended (e.g., specified) target trace impedance for other signal traces $227_1$ to $227_N$, which also equals the source impedance $Z_S$ value defined in the design specifications for the programmable integrated circuit 110. Table 1 below lists example design specifications of step 602 for various test path components 402 of FIG. 5A as they may be defined in the combination of programmable integrated circuit die/chip design/stackup and schematic/PCB design/stackup.

TABLE 1

Test Path Design Specifications

| Component | Design Specification |
|---|---|
| Source Impedance ($Z_S$) | 50 Ohms (Ω) |
| Signal Generator Step Pulse ($V_S$) | 1 Volt (V) |
| Load Impedance ($Z_L$) | 50 Ohms (Ω) |
| Trace Length (d) | 1 inch |
| Step Pulse Velocity (Vprop) | 6 inches/nanosecond |
| Designated ADC Sample Times | (0.5)τ, (1.5)τ |
| Maximum Allowable Impedance Variation Threshold for Trace Impedance ($Z_O = Z_t$) | 45Ω (90% of Source Impedance $Z_S$) and 55Ω (110% of Source Impedance $Z_S$) |

In step 604, programmable integrated circuit 110 and PCB 217 are separately fabricated according to the design specifications of step 602 and assembled together as system-level board 111 of FIG. 2A. In one embodiment, the assembled system-level board 111 may then be installed in step 604 within information handling system 100 and operably coupled to PCH 150 and other components of system 100 of FIG. 1.

In step 606, a maximum voltage difference threshold ($\Delta V_{TH}$) value may be determined for the installed system-level board 111 of step 604 based on the example test path design specifications of Table 1 as follows. In one embodiment, step 606 may be initiated by a system user entering a command via I/O devices 170, although programmable integrated circuit 110 may alternatively be programmed to automatically initiate step 606, e.g., such as on every system boot of system 100.

In this example, the determined voltage difference threshold ($\Delta V_{TH}$) corresponds to a selected lower limit maximum allowable impedance value difference between the source impedance $Z_S$ and the actual trace impedance ($Z_O$=$Z_t$) of test path 402 of system-level board 111 of FIG. 5A. In FIG. 5A, source impedance $Z_S$ is 50Ω, known load impedance $Z_L$ is 50Ω, and trace length (d) between source impedance $Z_S$ and load impedance $Z_L$ is 1 inch. In the example of FIG. 5A, signal generator 202 creates a step pulse ($V_S$) of 1 volt, that is propagated through the circuit path components 402 of FIG. 5A at a velocity (Vprop) of 6 inches/nanosecond. Therefore, the time (τ) for the signal to travel the entire trace length (d) is equal to the trace length (d) of 1 inch divided by the (Vprop) of 6 inches/nanosecond, or time (τ)=⅙$^{th}$ nanoseconds.

Still referring to step 606, TIM logic 102 is programmed to cause ADC 204 to sample voltage at the location of node 245 at a time (½)τ or (0.5)τ, and again at a time (1.5)τ. This is illustrated by the voltage bounce diagram of FIG. 5B. FIG. 5C shows reflection coefficients ($\Gamma_S$) and ($\Gamma_L$) corresponding to the FIGS. 5A and 5B and determined for a selected lower limit maximum allowable 90% impedance variation threshold for trace impedance ($Z_O$=$Z_t$) which, in this case, is 451 or 90% of the intended (specified) trace impedance value 50Ω. It will be understood that a selected lower limit 90% maximum allowable impedance variation threshold is exemplary only, and that values greater or less than 90% may be employed in other embodiments.

It will also be understood that in an alternative embodiment, reflection coefficients ($\Gamma_S$) and ($\Gamma_L$) may be alternatively determined in the same manner for a selected upper limit maximum allowable impedance variation threshold for trace impedance ($Z_O$=$Z_t$), i.e., in this case 55Ω or 110% of the intended (specified) trace impedance value (50Ω) where the maximum allowable impedance variation threshold is intended to be +/−10% of this intended (specified) trace impedance value. In such a case, the same process may be used to determine reflection coefficients ($\Gamma_S$) and ($\Gamma_L$) for trace impedance ($Z_O$=$Z_t$), however the signal reflections will be inverted. Such a separate calculation may be desirable, for example, where a selected upper limit maximum allowable impedance variation is used in the methodology 600 rather than the selected lower limit maximum allowable impedance variation.

Figure 5B:
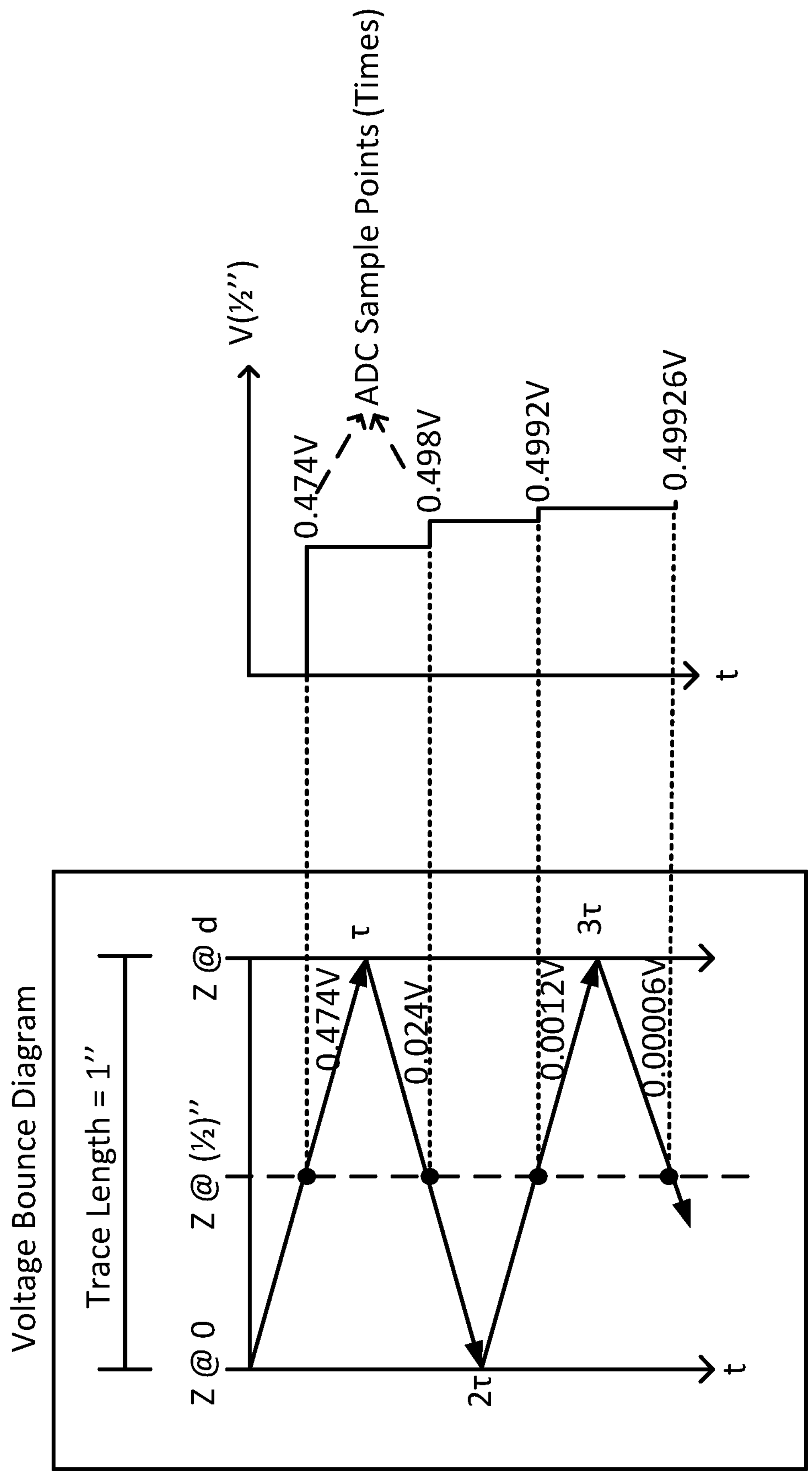
FIG. 5B illustrates a voltage bounce diagram according to one exemplary embodiment of the disclosed systems and methods.

FIG. 5D shows voltage bounce values that may be used in step 606 to determine the maximum voltage difference threshold ($\Delta V_{TH}$) value for test path components 402 of FIG. 5A that are configured according to the example design specifications Table 1. As shown in FIG. 5B, the sampled voltage at designated time (½)τ is $V_1^+$ which will equal 0.474 Volts, and the sampled voltage at designated time (1.5)τ is $V_1^+ + V_1^-$ (or 0.474 Volts+0.024 Volts=0.498 Volts). Thus, for the selected lower limit 90% maximum allowable impedance variation threshold for the particular circuit configuration 402, the maximum voltage difference threshold ($\Delta V_{TH}$) value may be calculated as the difference between the voltage sampled at time (½)τ and time (1.5)τ which in this example is 0.498 Volts−0.474 Volts=0.024 Volts (or 24 milliVolts). The same value of maximum voltage difference threshold ($\Delta V_{TH}$) value may be alternatively calculated using a selected upper limit 110% maximum allowable impedance variation threshold in the manner described previously. It will also be understood that a maximum voltage difference threshold ($\Delta V_{TH}$) value may be similarly calculated in other embodiments for greater or lesser values of maximum allowable impedance variation thresholds for circuit 402 using the equations of FIGS. 4D and 4E.

It will be understood that step 606 is optional, and that the determination of step 606 need not be performed in the sequence illustrated. In this regard, a maximum voltage difference threshold ($\Delta V_{TH}$) value may alternatively be determined at any other suitable time before performing step 161 described hereinbelow. For example, the determination of step 606 may in one embodiment be determined prior to step 602 of methodology 600.

In this embodiment, once a maximum voltage difference threshold ($\Delta V_{TH}$) value is determined in step 606 (or otherwise) for a given selected maximum allowable impedance variation threshold and circuit configuration design 402, it may be compared to an absolute value of an actual measured voltage differential ($\Delta V_M$) of a manufactured system level board 111 from step 604 that has the same test path configuration design 402 as FIG. 5A. This actual measured voltage differential ($\Delta V_M$) may be determined, for example, by creating a step pulse ($V_S$) in step 607 using signal generator 202 of the manufactured system board 111, and then using the ADC 204 of the manufactured system level board 111 in step 608 to sample node 245 voltages ($V_{T1}$) at a time (½)τ and ($V_{T2}$) at a time (1.5)τ, i.e., while the voltage at node 245 is responding to the step pulse ($V_S$). In step 610, these sampled voltage values ($V_{T1}$) and ($V_{T2}$) obtained at respective times (0.5)τ and time (1.5)τ may then be stored in register 208 of programmable integrated circuit 110 of the manufactured system board 111. In other embodiments, sampled voltage values ($V_{T1}$) and ($V_{T2}$) may be stored in other memory or storage area of system 100, e.g., such as volatile system memory 180, non-volatile system storage 160, NVM 190, etc.

In step 612, these stored voltage values ($V_{T1}$) and ($V_{T2}$) may be optionally reported off-chip from register 208 to another separate device, e.g., from information handling system 100 across network 195 to remote system 197 of FIG. 1 at the request of a local system user of system 100 or a remote administrator using remote system 197. In alternative embodiments of step 612, these stored voltage values ($V_{T1}$) and ($V_{T2}$) may be downloaded locally from register 208 to another information handling system or memory card, and/or may be optionally processed further by programmable integrated circuit 110 of system 100 itself, e.g., under control of a user of system 100. In another embodiment of step 612, a system user may enter a command via I/O devices 170 to programmable integrated circuit 110 to retrieve the stored voltage values ($V_{T1}$) and ($V_{T2}$) from register 208 and output these retrieved values ($V_{T1}$) and ($V_{T2}$) to the system user via display device 140, store these retrieved values ($V_{T1}$) and ($V_{T2}$) to system storage 160 or other storage device, etc.

Thus, in one embodiment, each of steps 607 to 612 may be performed by and/or under the control of TIM logic 102 of programmable integrated circuit 110. Further, one or more of the following steps 614 to 620 may be performed, for example, by a programmable integrated circuit of a remote system 197 or another information handling system. However, it is also possible that one or more of the following steps 614 to 620 may alternatively be performed by programmable integrated circuit 110 of system 100 in which case, for example, ($\Delta V_M$) and/or $|(\Delta V_M)|$ (which are described further below) may be optionally stored in register 208 and then reported from information handling system 100 across network 195 to remote system 197 of FIG. 1 for further processing. In any case, ($\Delta V_M$) and/or $|(\Delta V_M)|$ explain or indicate the reflection amount within test signal trace 115 and therefore also explain or indicate whether the transmission line impedance of test signal trace 115 is within or out of specification.

Returning to methodology 600, in step 614, the actual measured voltage differential ($\Delta V_M$) of the tested manufactured system level board 111 may then be calculated in step 614 as the difference between the voltage ($V_{T1}$) sampled by ADC 204 at time (½)τ and the voltage ($V_{T2}$) sampled by ADC 204 at time (1.5)τ. In this regard, ($\Delta V_M$) may be either a positive voltage differential ($\Delta V_1$) or a negative voltage differential ($\Delta V_2$) as shown in FIG. 3. The absolute value of this measured voltage differential $|(\Delta V_M)|$ may then be compared to the maximum voltage difference threshold ($\Delta V_{TH}$) value of step 606 to determine if the absolute value of the determined maximum voltage difference threshold $|(\Delta V_M)|$ is greater than the maximum voltage difference threshold ($\Delta V_{TH}$) value.

If $|(\Delta V_M)|$ is found greater than ($\Delta V_{TH}$) in step 616, then methodology 600 proceeds to step 618 where the trace impedance of the manufactured system level board 111 is reported to be out of specification, e.g., meaning in this example that the actual value of trace impedance ($Z_O$=$Z_t$) is less than 45Ω or greater than 55Ω. Thus, for the example test path circuit 402 configuration of Table 1 and FIG. 5A, this would be the case where the measured voltage differential ($\Delta V_M$) is a measured positive voltage differential ($\Delta V_1$) of greater than 24 milliVolts or a measured negative voltage differential ($\Delta V_2$) of less than −24 mVolts, which in either case indicates that the actual value of trace impedance ($Z_O$=$Z_t$) of the tested system board 111 varies by more than 10% from the specified intended trace impedance of 50Ω.

However, if $|(\Delta V_M)|$ is found to be less than or equal to ($\Delta V_{TH}$) in step 616, then methodology 600 proceeds to step 620 where the trace impedance of the manufactured system level board 111 is reported to be within specification, e.g., meaning in this example that the actual value of trace impedance ($Z_O$=$Z_t$) is from 45Ω to 55Ω. For the example test path circuit 402 configuration of Table 1 and FIG. 5A, this would be the case where the measured voltage differential ($\Delta V_M$) is a measured positive voltage differential ($\Delta V_1$) of less than 24 milliVolts or a measured negative voltage differential ($\Delta V_2$) of greater than −24 mVolts, which in either case indicates that the actual value of trace impedance ($Z_O$=$Z_t$) of the tested system board 111 varies by less than 10% from the specified intended trace impedance of 50Ω.

It will understood that the particular order and combination of the steps of FIG. 6 are exemplary only, and that other combinations of fewer, additional and/or alternative steps may be employed that are suitable for providing on-board trace impedance testing for system level boards. Moreover, it will be understood that methodology 600 may be employed in combination with other techniques and/or to enable other and/or further capabilities. For example, in one exemplary embodiment, programmable integrated circuit 110 may run its own on-board impedance check using TIM logic 102 to perform steps 610 and/or 614 to 620. Programmable integrated circuit 110 may then execute firmware (e.g., stored in non-volatile memory 190, flash memory, etc.) to respond to any determination made in steps 616 and 618 that the value of trace impedance ($Z_O$=$Z_t$) is out of specification by using two control signals that act as select signals for a multiplexer (mux) provided in silicon of programmable integrated circuit 110 within the signal path of each of signal traces 115 and 227. In such an optional embodiment, the mux select signals may be used to select output of the multiplexer from being no additional fixed resistor within the multiplexer output to be a selected one of multiple fixed resistors of varying impedance provided in-silicon of programmable integrated circuit 110 that are coupled to each of signal traces 227 and 115 so as to tune its source termination impedance ($Z_S$) so that the value of trace impedance ($Z_O$=$Z_t$) becomes within specification and/or otherwise to minimize reflections. In one embodiment, at least two such fixed resistors of varying impedance in the multiplexer output may be provided in-silicon of programmable integrated circuit 110 that result in +10% and −10% of intended source termination impedance ($Z_S$), respectively. In one such embodiment, the sampled voltage values ($V_{T1}$) and ($V_{T2}$) of step 610 may be used by programmable integrated circuit 110 to determine direction and magnitude of trace impedance ($Z_O$=$Z_t$) change to bring its value into specification.

It will also be understood that one or more of the tasks, functions, or methodologies described herein (e.g., including those described herein for components 110, 140, 150, 160, 170, 171, 175, 180, 181, 190, 195, 197, etc.) may be implemented by circuitry and/or by a computer program of instructions (e.g., computer readable code such as firmware code or software code) embodied in a non-transitory tangible computer readable medium (e.g., optical disk, magnetic disk, non-volatile memory device, etc.), in which the computer program includes instructions that are configured when executed on a processing device in the form of a programmable integrated circuit (e.g., processor such as CPU, controller, microcontroller, microprocessor, ASIC, etc. or programmable logic device "PLD" such as FPGA, complex programmable logic device "CPLD", etc.) to perform one or more steps of the methodologies disclosed herein. In one embodiment, a group of such processing devices may be selected from the group consisting of CPU, controller, microcontroller, microprocessor, FPGA, CPLD and ASIC. The computer program of instructions may include an ordered listing of executable instructions for implementing logical functions in an processing system or component thereof. The executable instructions may include a plurality of code segments operable to instruct components of an processing system to perform the methodologies disclosed herein.

It will also be understood that one or more steps of the present methodologies may be employed in one or more code segments of the computer program. For example, a code segment executed by the information handling system may include one or more steps of the disclosed methodologies. It will be understood that a processing device may be configured to execute or otherwise be programmed with software, firmware, logic, and/or other program instructions stored in one or more non-transitory tangible computer-readable mediums (e.g., data storage devices, flash memories, random update memories, read only memories, programmable memory devices, reprogrammable storage devices, hard drives, floppy disks, DVDs, CD-ROMs, and/or any other tangible data storage mediums) to perform the operations, tasks, functions, or actions described herein for the disclosed embodiments.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touch screen and/or a video display. The information handling system may also include one or more buses operable to transmit communications between the various hardware components.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems and methods may be utilized in various combinations and/or independently. Thus the invention is not limited to only those combinations shown herein, but rather may include other combinations.

What is claimed is:

1. A system board, comprising:

a printed circuit board (PCB) comprising a first signal trace having an unknown impedance ($Z_t$), the first signal trace defining a first electrically conductive circuit path between a first node and a second node of the PCB;

a first impedance element having a known impedance value ($Z_L$) electrically coupled in series in the first electrically conductive circuit path between the first node and the second node; and a programmable integrated circuit mechanically attached and electrically coupled to the PCB, the programmable integrated circuit defining an integrated second electrically conductive circuit path between the first and second nodes, the second electrically-conductive circuit path comprising a known source impedance ($Z_S$);

where the programmable integrated circuit is programmed to:

provide a voltage pulse from the second electrically conductive signal path through the source impedance ($Z_S$) and first node to the first electrically conductive signal path, and then sample multiple voltage values over time at a third node positioned between the source impedance ($Z_S$) and the first impedance while the voltage at the third node is responding to a voltage waveform created by the voltage pulse, the sampled multiple voltage values being indicative of magnitude of the unknown impedance ($Z_t$) of the first signal trace.

2. The system board of claim 1, where the programmable integrated circuit further comprises:

an integrated signal generator providing the voltage pulse at an output coupled to the second electrically conductive signal path, the source impedance ($Z_S$) being positioned between the output of the signal generator and the first node;

an integrated analog-to-digital converter (ADC) sampling the multiple voltage values over time at the third node while the voltage at the third node is responding to the voltage waveform created by the voltage pulse.

3. The system board of claim 2, the integrated analog-to-digital converter (ADC) sampling the multiple voltage values at a predefined sample rate selected to capture a predefined voltage or voltage range of the voltage waveform created at the third node by the voltage pulse.

4. The system board of claim 3, where the programmable integrated circuit is further programmed to calculate a trace impedance value or trace impedance value range from the sampled multiple voltage values of the voltage waveform.

5. The system board of claim 2, the programmable integrated circuit executing logic to:

control the integrated signal generator to provide the voltage pulse; and control the integrated ADC to sample the multiple voltage values over time at the third node while the voltage at the third node is responding to the voltage waveform created by the voltage pulse.

6. The system board of claim 5, where the programmable integrated circuit further comprises a register, the programmable integrated circuit executing logic to:

store the multiple sampled voltage values or one or more values derived from the multiple sampled voltage values in the register; and provide the stored multiple sampled voltage values or the one or more values derived from the multiple sampled voltage values off-chip to another device.

7. The system board of claim 1, where the PCB further comprises one or more additional signal traces separate from the first signal trace, each of the additional signal traces being coupled to other circuitry of the programmable integrated circuit and having the same unknown impedance ($Z_t$) as the first signal trace.

8. The system board of claim 1, where the programmable integrated circuit further comprises switching circuitry selectably controlled between a first switching configuration and a second switching configuration, the first switch configuration coupling the first signal trace to the first impedance element and the first node and the second node of the PCB to form the first electrically conductive circuit path with the first impedance element in series between the first node and the second node, and the second switching configuration coupling the first signal trace between other circuitry of the programmable integrated circuit and one or more off-board connectors of the PCB.

9. The system board of claim 1, where the system board is a motherboard and programmable integrated circuit is a central processing unit (CPU).

10. An information handling system, comprising:

a host programmable circuit mechanically attached and electrically coupled to a printed circuit board (PCB), the PCB comprising a first signal trace having an unknown impedance ($Z_t$) and defining a first electrically conductive circuit path between a first node and a second node of the PCB, and one or more additional signal traces separate from the first signal trace, each of the additional signal traces being coupled to other circuitry of the programmable integrated circuit and having the same unknown impedance ($Z_t$) as the first signal trace; and at least one of system storage or system memory coupled to the other circuitry of the host programmable integrated circuit by at least one of the additional signal traces;

where a first impedance element having a known impedance value ($Z_L$) is electrically coupled in series in the first electrically conductive circuit path between the first node and the second node;

where the programmable integrated circuit defines an integrated second electrically conductive circuit path between the first and second nodes, the second electrically-conductive circuit path comprising a known source impedance ($Z_S$); and where the programmable integrated circuit is programmed to:

provide a voltage pulse from the second electrically conductive signal path through the source impedance ($Z_S$) and first node to the first electrically conductive signal path, and then sample multiple voltage values over time at a third node positioned between the source impedance ($Z_S$) and the first impedance while the voltage at the third node is responding to a voltage waveform created by the voltage pulse, the sampled multiple voltage values being indicative of magnitude of the unknown impedance ($Z_t$) of the first signal trace.

11. The information handling system of claim 10, where the programmable integrated circuit further comprises:

an integrated signal generator providing the voltage pulse at an output coupled to the second electrically conductive signal path, the source impedance ($Z_S$) being positioned between the output of the signal generator and the first node; and an integrated analog-to-digital converter (ADC) sampling the multiple voltage values over time at the third node while the voltage at the third node is responding to the voltage waveform created by the voltage pulse, the integrated analog-to-digital converter (ADC) sampling the multiple voltage values at a predefined sample rate selected to capture a predefined voltage or voltage range of the voltage waveform created at the third node by the voltage pulse;

where the programmable integrated circuit is further programmed to:

control the integrated signal generator to provide the voltage pulse, and control the integrated ADC to sample the multiple voltage values over time at the third node while the voltage at the third node is responding to the voltage waveform created by the voltage pulse.

12. The information handling system of claim 10, where the programmable integrated circuit is further programmed to calculate a trace impedance value or trace impedance value range from the sampled multiple voltage values of the voltage waveform.

13. The information handling system of claim 10, further comprising a network interface device coupled to the other circuitry of the host programmable integrated circuit by at least one of the additional signal traces; where the programmable integrated circuit further comprises a register, and where the programmable integrated circuit is programmed to:

store the multiple sampled voltage values or one or more values derived from the multiple sampled voltage values in the register; and provide the stored multiple sampled voltage values or the one or more values derived from the multiple sampled voltage values to a remote information handling system that is separate from the information handling system via the network interface device and an external network coupled between the information handling system and the remote system.

14. The information handling system of claim 10, where the system board is a motherboard; and where the programmable integrated circuit is a central processing unit (CPU).

15. A method, comprising executing logic on a programmable integrated circuit, the programmable integrated circuit mechanically attached and electrically coupled to a PCB;

where the PCB comprises a first signal trace having an unknown impedance ($Z_t$), the first signal trace defining a first electrically conductive circuit path between a first node and a second node of the PCB, and a first impedance element having a known impedance value ($Z_L$) electrically coupled in series in the first electrically conductive circuit path between the first node and the second node;

where the programmable integrated circuit defines an integrated second electrically conductive circuit path between the first and second nodes, the second electrically-conductive circuit path comprising a known source impedance ($Z_S$); and where the method further comprises using the programmable integrated circuit to:

provide a voltage pulse from the second electrically conductive signal path through the source impedance ($Z_S$) and first node to the first electrically conductive signal path, and then sample multiple voltage values over time at a third node positioned between the source impedance ($Z_S$) and the first impedance while the voltage at the third node is responding to a voltage waveform created by the voltage pulse, the sampled multiple voltage values being indicative of magnitude of the unknown impedance ($Z_t$) of the first signal trace.

16. The method of claim 15, further comprising at least one of storing the multiple voltage values in a register of the programmable integrated circuit, or analyzing the multiple voltage values to determine a magnitude of the unknown impedance ($Z_t$) of the first signal trace or whether the magnitude of the unknown impedance ($Z_t$) of the first signal trace is within a predefined range of magnitude of the unknown impedance ($Z_t$) of the first signal trace.

17. The method of claim 15, where the programmable integrated circuit further comprises an integrated signal generator providing the voltage pulse at an output coupled to the second electrically conductive signal path, the source impedance ($Z_S$) being positioned between the output of the signal generator and the first node, and an integrated analog-to-digital converter (ADC) sampling the multiple voltage values over time at the third node while the voltage at the third node is responding to the voltage waveform created by the voltage pulse; and where the method further comprises using the programmable integrated circuit to:

control the integrated signal generator to provide the voltage pulse; and control the integrated analog-to-digital converter (ADC) to sample the multiple voltage values at a predefined sample rate selected to capture a predefined voltage or voltage range of the voltage waveform created at the third node by the voltage pulse.

18. The method of claim 17, further comprising using the programmable integrated circuit to calculate a trace impedance value or trace impedance value range from the sampled multiple voltage values of the voltage waveform.

19. The method of claim 15, where the programmable integrated circuit further comprises a register, and where the method further comprising using the programmable integrated circuit to:

store the multiple sampled voltage values or one or more values derived from the multiple sampled voltage values in the register; and provide the stored multiple sampled voltage values or the one or more values derived from the multiple sampled voltage values off-chip to another device.

20. The method of claim 15, where the system board is a motherboard of an information handling system and the programmable integrated circuit is a central processing unit (CPU).

* * * * *